(12) United States Patent
Lee et al.

(10) Patent No.: US 6,762,083 B2
(45) Date of Patent: Jul. 13, 2004

(54) METHOD FOR MANUFACTURING HETEROJUNCTION FIELD EFFECT TRANSISTOR DEVICE

(75) Inventors: Jong-Lam Lee, Pohang (KR); Chang Min Jeon, Seoul (KR); Ho Won Jang, Kyungsangbuk-do (KR)

(73) Assignee: Pohang University of Science and Technology Foundation (KR)

( * ) Notice: Subject to any disclaimer, the term of this patent is extended or adjusted under 35 U.S.C. 154(b) by 103 days.

(21) Appl. No.: 10/102,856

(22) Filed: Mar. 22, 2002

(65) Prior Publication Data

US 2003/0080347 A1 May 1, 2003

(30) Foreign Application Priority Data

Oct. 26, 2001 (KR) .................................... 2001-0066452

(51) Int. Cl.[7] ........................ H01L 21/338; H01L 21/28; H01L 31/0328
(52) U.S. Cl. ........................ 438/172; 438/167; 438/169; 438/285; 438/571; 438/572; 438/573; 257/192; 257/194
(58) Field of Search ................................ 438/167, 192, 438/285, 169, 501, 572, 593, 575, 580, 72, 571–573; 257/192, 194, 187, 189, 12, 24, 27, 103, 471, 472, 473

(56) References Cited

U.S. PATENT DOCUMENTS

2001/0034116 A1 * 10/2001 Lee et al. .................... 438/604
2002/0066908 A1 *  6/2002 Smith ......................... 257/194
2002/0167023 A1 * 11/2002 Chavarkar et al. .......... 257/194

* cited by examiner

Primary Examiner—Donghee Kang
(74) Attorney, Agent, or Firm—Rothwell, Figg, Ernst & Manbeck

(57) ABSTRACT

A method for manufacturing a hetero-junction field effect transistor (HFET) device, which includes sequentially forming a non-doped GaN semiconductor layer and an AlGaN semiconductor layer on a substrate, separating devices from each other by etching the substrate, forming a photoresist layer pattern on the AlGaN semiconductor layer and forming gate electrodes by depositing a material on the substrate using the photoresist layer pattern, treating the surface of the AlGaN semiconductor layer, and forming a photoresist layer pattern on the substrate and forming ohmic electrodes by depositing a metal on the substrate using the photoresist layer pattern, is provided. Accordingly, it is possible to overcome a difficulty in aligning the gate electrode with the ohmic electrodes and prevent a substrate from having a step difference introduced by the ohmic electrodes because the gate electrode is formed before the ohmic electrodes are formed. It is possible to form a finer photoresist layer pattern used to form the gate electrode and improve the degree, to which the gate electrode is aligned with the ohmic electrodes. In addition, since the surface of an AlGaN semiconductor layer is treated with ICP before the ohmic electrodes are formed. Thus, it is possible to obtain ohmic characteristics without heat-treating a metal deposited on the AlGaN semiconductor layer to form the ohmic electrodes. Finally, since the maximum transconductance and maximum drain current characteristics of the AlGaN/GaN HFET device are good, the AlGaN/GaN HFET device can have improved amplification capability.

9 Claims, 9 Drawing Sheets

METHOD FOR MANUFACTURING HETEROJUNCTION FIELD EFFECT TRANSISTOR DEVICE

BACKGROUND OF THE INVENTION

1. Field of the Invention

The present invention relates to a method for manufacturing a hetero-junction field effect transistor (HFET) device, and more particularly, to a method for manufacturing an AlGaN/GaN HFET device, which is capable of forming a fine gate electrode pattern and elevating the degree, to which a gate electrode are aligned with ohmic electrodes.

2. Description of the Related Art

As a frequency band for wireless communication services increases, processes for manufacturing communication devices becomes more complicated and more difficult. In the manufacture of a hetero-structure field effect transistor device, which is used as an amplification device for high frequency communication, techniques of forming a source electrode, a drain electrode, and a gate electrode are very important to determine the electrical characteristics and frequency characteristics of the device.

An AlGaN/GaN HFET device is a device which is capable of maximizing mobility of electrons by forming a hetero junction of AlGaN having a large band gap and GaN having a narrow band gap together to form a quantum well at the interface therebetween and thus trapping the electrons in the quantum well. In the HFET device, the amount of current is controlled by applying voltage to a gate electrode in Schottky contact with the semiconductors, in which electrons flow along a channel between a source electrode and a drain electrode that are in ohmic contact with the semiconductors. Accordingly, the contact resistance of the ohmic electrodes (i.e., the source and drain electrodes) strongly affects the direct current characteristics of the HFET device, such as drain current, transconductance, or knee voltage, and the frequency characteristics of the HFET device, such as associate gain or power added efficiency. Until now, in order to improve the electrical characteristics and frequency characteristics of a HFET device, various efforts have been made to decrease the gap between source and drain electrodes and reduce the size of a gate electrode formed between ohmic electrodes to below a sub-micron level. Accordingly, techniques of manufacturing a fine gate electrode in a narrow gap between source and drain electrodes and aligning the gate electrode with the source and drain electrodes are very important to determine the reproducibility and performance of a HFET device.

Figure 1A:
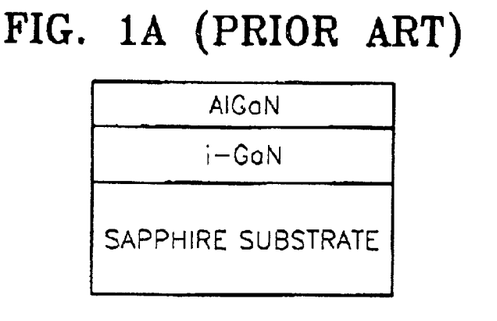
FIGS. 1A through 1D are views illustrating a conventional method for manufacturing a hetero-junction field effect transistor (HFET) device.
Figure 1B:
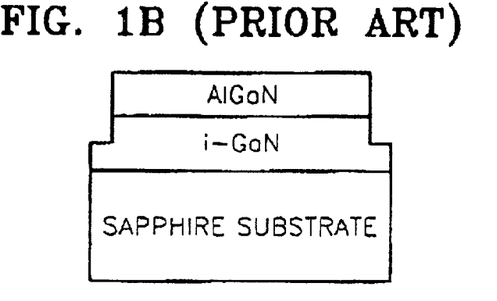
Figure 1C:
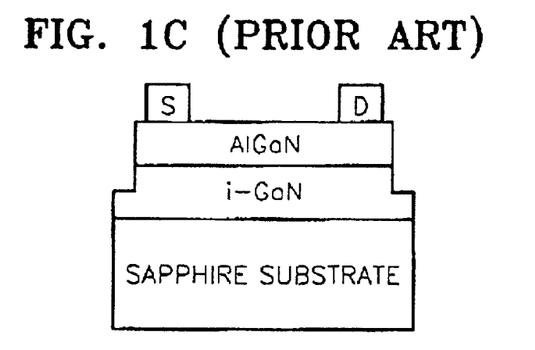

FIGS. 1A through 1D are views illustrating a conventional method for manufacturing a HFET device. Referring to FIG. 1A, a non-doped GaN semiconductor layer (I-GaN semiconductor layer) and an AlGaN semiconductor layer are sequentially deposited on a sapphire substrate. Next, referring to FIG. 1B, devices are isolated by etching the substrate to a predetermined depth of the i-GaN semiconductor layer. Next, referring to FIG. 1C, a source electrode (S) and a drain electrode (D) are formed on the AlGaN semiconductor layer and are rapidly heat-treated at a temperature of no less than 600° C. for 10 or more seconds, thereby forming an ohmic contact. Since the ohmic contact is formed at a high temperature of no less than 500° C., an area of ohnimic electrode in the direction of the width of the AlGaN semiconductor is increased, and thus the gap between the source electrode (S) and the drain electrode (D) becomes narrower.

Figure 1D:
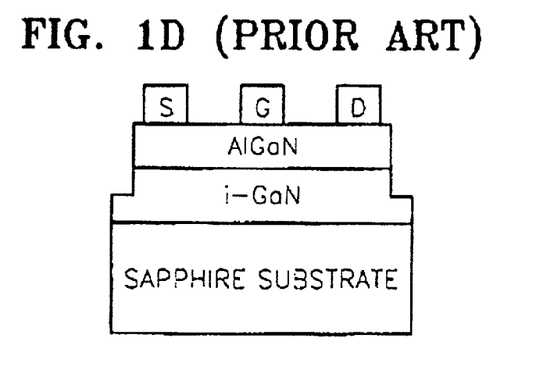

Next, referring to FIG. 1D, a gate electrode pattern is formed of photoresist. Next, a gate electrode (G) is formed using the gate electrode pattern.

However, the gate electrode (G) may lose its Schottky characteristics according to conditions of heat treatment. Thus, in the above method, the gate electrode (G) is formed after the source electrode (S) and the drain electrode (D) are deposited and heat-treated to form the ohmic electrodes.

In the meantime, as the line width of a gate electrode of a device becomes smaller, the characteristics of the gate electrode become superior. However, in the case of a photoresist layer pattern used to form a photoresist layer pattern used to form a fine gate electrode on a substrate having a step difference introduced by a source electrode and a drain electrode, the thickness of a photoresist layer is greatest between the source electrode and the drain electrode on the surface of the substrate. Thus, it becomes more difficult to form a fine gate electrode pattern, and the reproducibility of the formation of a gate electrode pattern may be lowered. Accordingly, it is difficult to form a gate electrode having a small line width and thus satisfy a design rule previously set when designing a semiconductor device.

SUMMARY OF THE INVENTION

To solve the above-described problems, it is an object of the present invention to provide a method for manufacturing an AlGaN/GaN HFET device, which is capable of easily forming a fine gate electrode pattern.

Accordingly, to achieve the above object, there is provided a method for manufacturing a hetero-junction field effect transistor (HFET) device. The method includes (a) sequentially forming a non-doped GaN semiconductor layer and an AlGaN semiconductor layer on a substrate, (b) separating devices from each other by etching the substrate, (c) forming a photoresist layer pattern on the AlGaN semiconductor layer and forming gate electrodes by depositing a material on the substrate using the photoresist layer pattern, (d) treating the surface of the AlGaN semiconductor layer, and (e) forming a photoresist layer pattern on the substrate and forming ohmic electrodes by depositing a metal on the substrate using the photoresist layer pattern.

The step (d) is preferably performed using inductively coupled plasma (ICP). The step (d) is preferably performed using ICP generated from at least one selected from the group consisting of $N_2$, Ar, $Cl_2$, $BCl_3$, $H_2$, and $O_2$. The step (d) is preferably performed using ICP in a chamber having a pressure of 5–10 mTorr with a gas flow rate of 10–30 sccm, a source power of 200–800 W, and a chuck power of 50–100 W for 1–3 minutes.

The material used to form the gate electrodes in the step (c) and the material used to form the ohmic electrodes in the step (e) are deposited on the substrate by electron beam deposition or thermal deposition. The gate electrodes are formed of at least one selected from the group consisting of Pt, Pd, Ni, and Au. The ohmic electrodes are formed of a Ti/Al layer or a Ti/Al/Ni/Au layer.

Preferably, the substrate is a sapphire substrate or a silicon carbide substrate.

BRIEF DESCRIPTION OF THE DRAWINGS

The above objects and advantages of the present invention will become more apparent by describing in detail preferred embodiments thereof with reference to the attached drawings in which:

FIGS. 6(a) and (b) are energy-band diagrams of an interface between ohmic electrodes that are formed of metals according to Example 1 of the present invention and semiconductor layers before and after being ICP treated;

DETAILED DESCRIPTION OF THE INVENTION

In a method for manufacturing a HFET device according to the present invention, ohmic electrodes having a large line width are formed after a gate electrode having a small line width is formed. Accordingly, it is possible to easily align the gate electrode between the ohmic electrodes and thus reduce the step difference of a substrate caused by the ohmic electrodes. In addition, it is possible to form a finer photoresist pattern used to form the gate pattern.

Since inductively coupled plasma (ICP) treatment is performed on the surface of an AlGaN semiconductor layer, on which gate electrodes are already formed but ohmic electrodes are not formed yet, it is possible to allow electrodes to have ohmic characteristics without heat-treating a metal deposited on the AlGaN semiconductor layer to form ohmic electrodes.

Hereinafter, the method for manufacturing a HFET device according to the present invention will be described more fully with reference to FIGS. 2A through 2D.

Figure 2A:
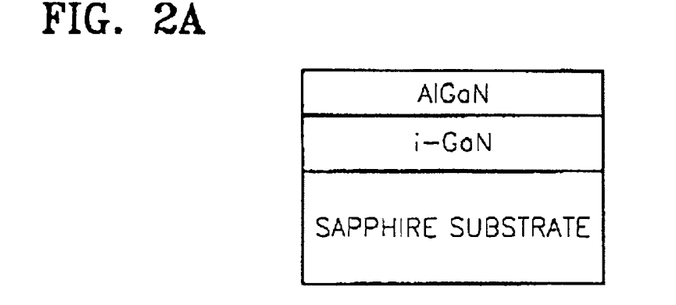
FIGS. 2A through 2D are views illustrating a method for manufacturing a HFET device according to the present invention.

Referring to FIG. 2A, a non-doped i-GaN semiconductor layer and an AlGaN semiconductor layer are sequentially deposited on a substrate. Here, the substrate may be a sapphire substrate or a silicon carbide (SiC) substrate. In the present embodiment, a sapphire substrate is used.

Figure 2B:
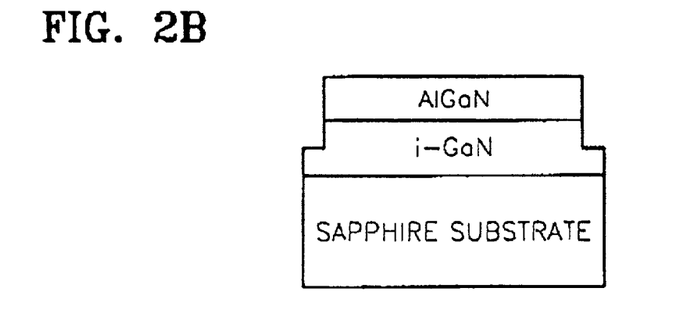

Next, referring to FIG. 2B, devices are isolated by mesa-etching the substrate to a predetermined depth of the i-GaN layer, which acts as a buffer layer. Here, the AlGaN layer and i-GaN semiconductor layers are etched by dry etching.

Figure 2C:
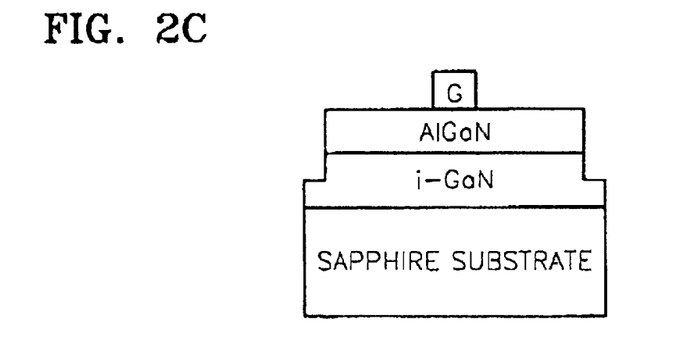

Next, referring to FIG. 2C, a photoresist pattern is formed on the AlGaN semiconductor layer in a desired gate electrode pattern by image reversal lithography. Next, a material is deposited using the photoresist layer pattern, thereby forming gate electrodes (G). Here, the material used to form the gate electrodes (G) is deposited by electron beam deposition or thermal deposition. The gate electrodes (G) is formed of Pt, Pd, Ni, or Au or any combination thereof.

Next, the surface of the substrate is treated before ohmic electrodes are not formed yet so that the ohmic electrodes can be formed at room temperature.

The surface of the substrate is preferably treated using inductively coupled plasma (ICP) generated from $N_2$ gas, Ar gas, $Cl_2$ gas, $BCl_3$ gas, $H_2$ gas, $O_2$ gas, or any combination thereof.

Figure 2D:
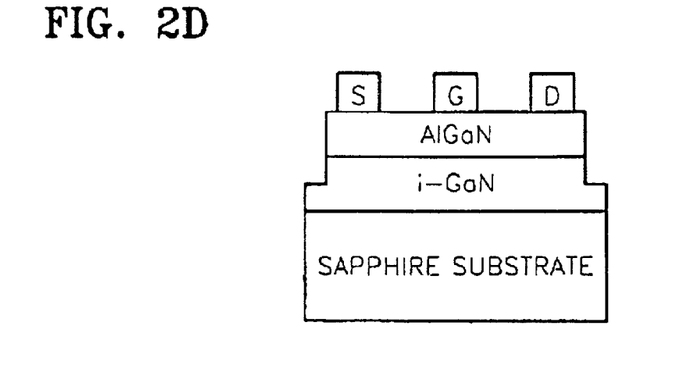

Next, a photoresist layer pattern is formed in a desired ohmic electrode pattern by image reversal lithography, and then a metal is deposited on the substrate using the photoresist layer pattern, thereby forming ohmic electrodes, i.e., a source electrode (S) and a drain electrode (D). Then, a HFET device is completed, as shown in FIG. 2D. Here, the ohmic electrodes are formed of a Ti/Al layer or a Tl/Al/Ni/Au layer by electron beam deposition or thermal deposition.

In the method for manufacturing a HFET device according to the present invention, unlike in the prior art, a gate electrode pattern is formed on a planar substrate, on which ohmic electrodes are not formed yet. Thus, it is possible to form a gate electrode having a small line width, increase the degree, to which the gate electrode is aligned with the ohmic electrodes, and sufficiently satisfy a design rule.

In a HFET device manufactured by the above method, the line width of a gate electrode is about 0.5–1 μm, and the thickness of the gate electrode is about 100–500 Å. The thickness of the ohmic electrodes is not restricted but may be about 2000–4000 Å.

Hereinafter, the present invention will now be described more fully with reference to a first embodiment. However, the present invention should not be construed as being limited to the embodiment set forth herein.

EXAMPLE 1

A non-doped GaN semiconductor layer and a non-doped AlGaN semiconductor layer were sequentially deposited on a sapphire substrate. Next, the resulting substrate was mesa-etched to a predetermined depth of the GaN layer.

Next, a photoresist layer was formed on the AlGaN semiconductor layer in a desired gate electrode pattern by image reversal lithography. Next, Pt was deposited at 6.5 KV and 220 mA to form gate electrodes.

Next, the surface of the resulting substrate was treated using inductively coupled plasma in a chamber having a pressure of 10 mTorr with a source power of 600 W, a chuck power of 100 W, and an $N_2$ flow rate of 10 sccm for 1 minute.

Next a photoresist layer pattern was formed in a desired ohmic electrode pattern by image reversal lithography. Ti and Al were sequentially deposited using the photoresist layer pattern to form ohmic electrodes, i.e., a source electrode (S) and a drain electrode (D). Then, a HFET device was completed. Ti and Al were deposited to a thickness of 200 Å and a thickness of 150 Å, respectively, to form the ohmic electrodes by thermal deposition.

EXAMPLES 2–6

The present embodiment was the same as the first embodiment described above except that the surface of a substrate was treated using inductively coupled plasma generated from at least one out of Ar gas, $Cl_2$ gas, $BCl_3$ gas, $H_2$ gas, and $O_2$ gas without using $N_2$ gas.

Comparative Example 1

A non-doped GaN semiconductor layer and a non-doped AlGaN semiconductor layer were sequentially deposited on a sapphire substrate. Next, the resulting substrate was etched to a predetermined depth of the GaN semiconductor layer.

Next, a photoresist layer was formed on the AlGaN semiconductor layer in a desired ohmic electrode pattern by image reversal lithography.

The surface of the resulting substrate was treated using an aqueous solution of hydrochloric acid ($HCl:H_2O=1:1$) for 1 minute. Next, Ti and Al were sequentially deposited on the substrate and were heat-treated at a temperature of about 550° C. to form ohmic electrodes.

Next, a photoresist layer pattern was formed in a desired gate electrode pattern by image reversal lithography. Pt was deposited using the photoresist layer pattern to form gate electrodes, and then a HFET device was completed.

Figure 3:
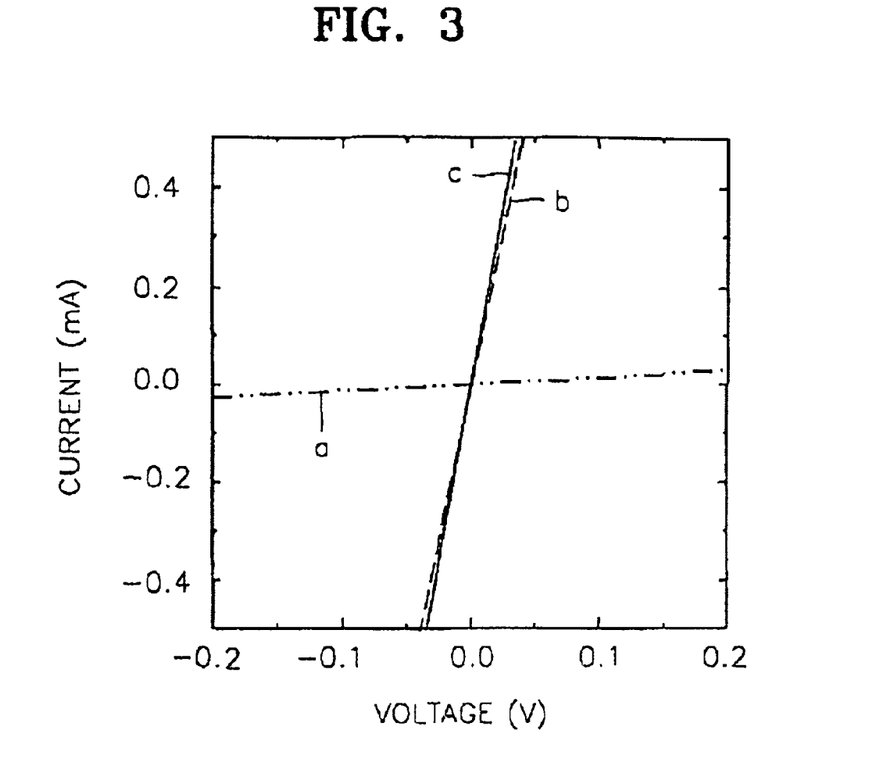
FIG. 3 is a graph showing the voltage-current characteristics of a HFET device according to Example 1 of the present invention and a HFET device according to Comparative example 1.

The current-voltage characteristics of the HFET devices manufactured in Example 1 and Comparative Example 1 are shown in FIG. 3. Referring to FIG. 3, in the case (a) of depositing metals used to form ohmic electrodes according to the deposition method described in Comparative Example 1, a HFET device has Schottky characteristics in which no current flows between a metal and a semiconductor. In the case (b) of depositing metals used to form ohmic electrodes and heat-treating the metals at a temperature of about 550° C. to form ohmic electrodes, the contact resistance of the ohmic electrodes is $2H\ 10^{-4}\ \Omega cm^2$ that is the minimum among the three cases (a), (b), and (c) shown in FIG. 3.

In the case (c) of treating the surface of a substrate, on which an AlGaN semiconductor layer is formed using inductively coupled plasma generated from $N_2$ gas, like in Example 1, electrodes have ohmic characteristics in which current varies in proportion to voltage. The contact resistance of the ohmic electrodes is $1.02\ H\ 10^{-4}\ \Omega cm^2$.

As described above, according to Example 1 of the present invention, since the surface of a substrate, on which an AlGaN semiconductor layer was formed, was treated using inductively coupled plasma, it was possible to allow electrodes to have ohmic characteristics without heat-treating ohmic metals deposited on the substrate at room temperature.

Figure 4:
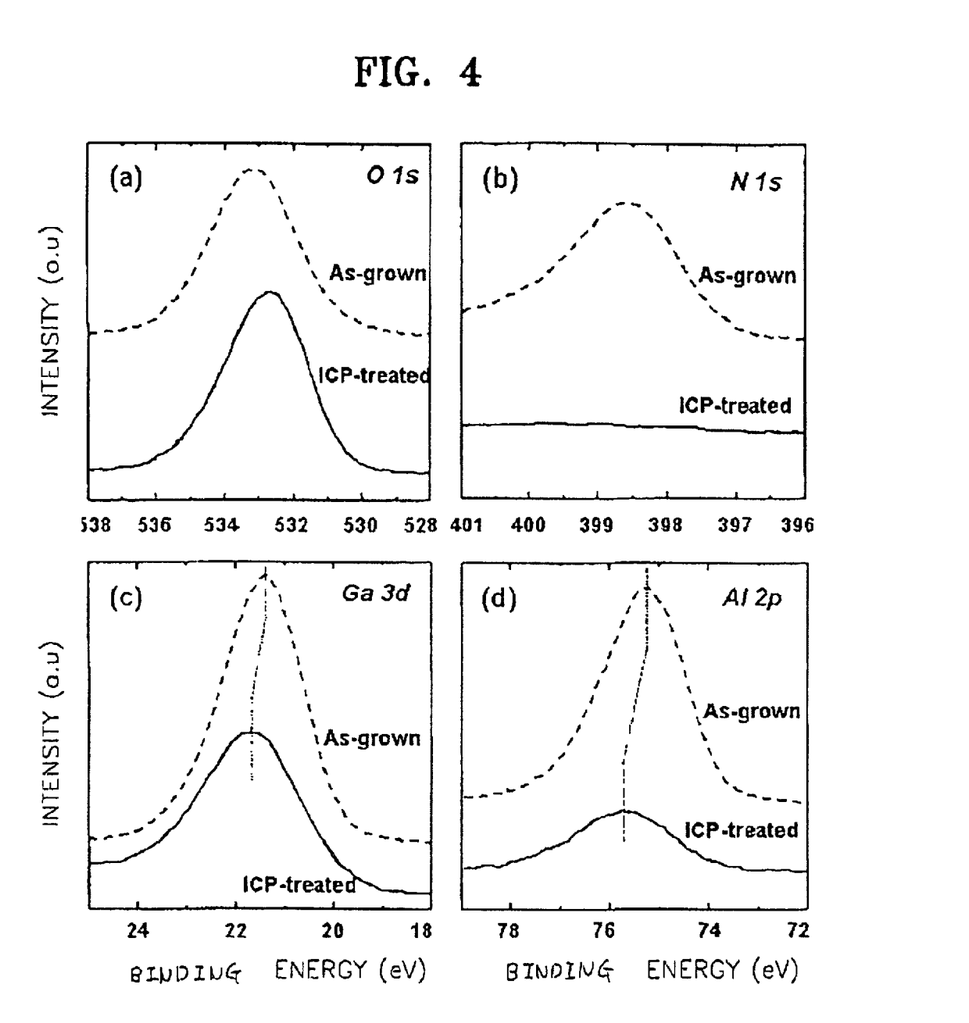
FIG. 4 includes graphs showing the photoelectron analysis deep level spectra of a sapphire substrate including an AlGaN semiconductor layer and surface-treated with inductively coupled plasma (ICP) according to Example 1 of the present invention.

In Example 1, after the surface of a sapphire substrate, on which an AlGaN semiconductor layer was formed, was treated using inductively coupled plasma generated from $N_2$ gas, the binding energy of atoms at the surface of the sapphire substrate was analysed by X-ray photoelectron spectroscopy, and the results are shown in FIG. 4. Referring to FIG. 4, in the case (c) of Ga 3d and the case (d) of Al 2p, the binding energy of atoms at the surface of the sapphire substrate was increased by about 0.3 eV due to ICP treatment. In addition, the amount of nitrogen was decreased after the surface of the sapphire substrate was treated with ICP.

Figure 5:
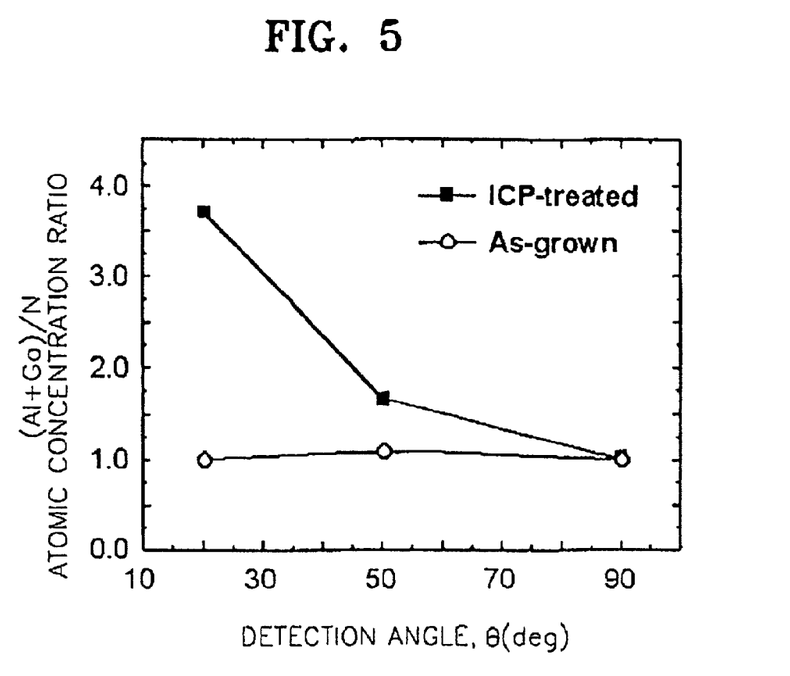
FIG. 5 is a graph showing the variation of (Al+Ga): N atomic concentration ratio of a sapphire substrate, on which an AlGaN semiconductor layer is formed, before and after ICP treated according to Example 1 of the present invention.

FIG. 5 is a graph showing the variation of (Al+Ga): N atomic concentration ratio of a sapphire substrate, on which an AlGaN semiconductor layer is formed, with respect to the variation of a detection angle between the surface of the sapphire substrate and a photoelectron detector before and after ICP treated according to the first embodiment of the present invention. Generally, if the surface of the AlGaN semiconductor layer on the sapphire substrate forms a large angle with the photoelectron detector, it is possible to obtain information concerning an atomic binding structure in the AlGaN semiconductor layer. If the surface of the AlGaN semiconductor layer forms a small angle with the photoelectron detector, it is possible to obtain information concerning an atomic binding structure at the surface of the AlGaN semiconductor layer.

If the ratio of N atomic concentration with respect to (Al+Ga) atomic concentration is supposed to be 1 when the surface of the AlGaN semiconductor layer forms a detection angle of 90 degrees with the photoelectron detector, it is possible to identify the atomic composition ratio depending on a depth from the surface of the AlGaN semiconductor layer based on the variation of the ratio of N atomic concentration with respect to (Al+Ga) atomic concentration in accordance with the variation of a detection angle. When when the surface of the AlGaN semiconductor layer forms a detection angle of 20 degrees with the photoelectron detector, an escape distance of the photoelectron from the surface of the AlGaN semiconductor layer is calculated to about 49.7 Å.

Referring to FIG. 5, as a detection angle between the surface of the sapphire substrate and the photoelectron detector decreases, in other words, as it is closer to the surface of the AlGaN semiconductor layer, the ratio of (Al+Ga) atomic concentration with respect to N atomic concentration increases. This means that the concentration of nitrogen vacancies at the surface of the AlGaN semiconductor layer increases. The energy level of a nitrogen vacancy is near a conduction band, in other words, the nitrogen vacancy has a low ionization energy, and thus electrons can be easily generated. Accordingly, the concentration of electrons increases at the surface of the AlGaN semiconductor layer treated with ICP.

Figure 6:
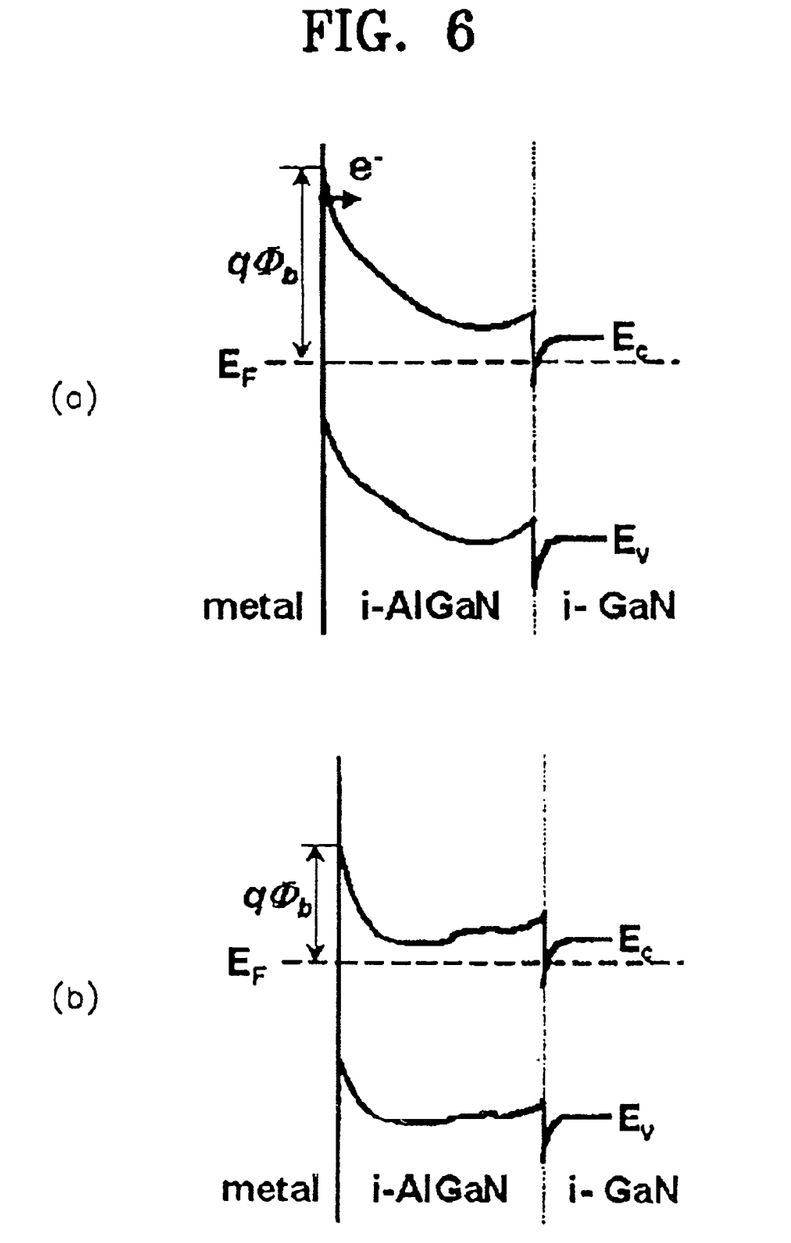

FIGS. 6(a) and (b) are energy-band diagrams of an interface between ohmic electrodes that are formed of metals according to Example 1 of the present invention and semiconductor layers before and after being ICP treated. Specifically, FIG. 6(a) is a diagram illustrating an energy band at the interface between ohmic electrodes and semiconductor layers which are not treated with ICP yet, and FIG. 6(b) is a diagram illustrating an energy band at the interface between ohmic electrodes and semiconductor layers after treated with ICP.

If the surface of the AlGaN semiconductor layer layer on the sapphire substrate is treated with ICP, a lot of nitrogen vacancies are generated, and the Fermi energy level of the AlGaN semiconductor layer varies toward a conduction band in accordance with the variation of the energy level of the nitrogen vacancies, and thus the surface of the AlGaN semiconductor layer, on which gate electrodes are already formed, has almost the same energy state as being highly-doped with nitrogen vacancies. Accordingly, the shape of the energy band at the interface between ohmic electrodes and semiconductor layers shown in FIG. 6(a) is changed into the shape shown in FIG. 6(b). In addition, since the width of a depletion region decreases, tunneling of electrons can easily occur, and thus electrodes can have ohmic characteristics.

Figure 7:
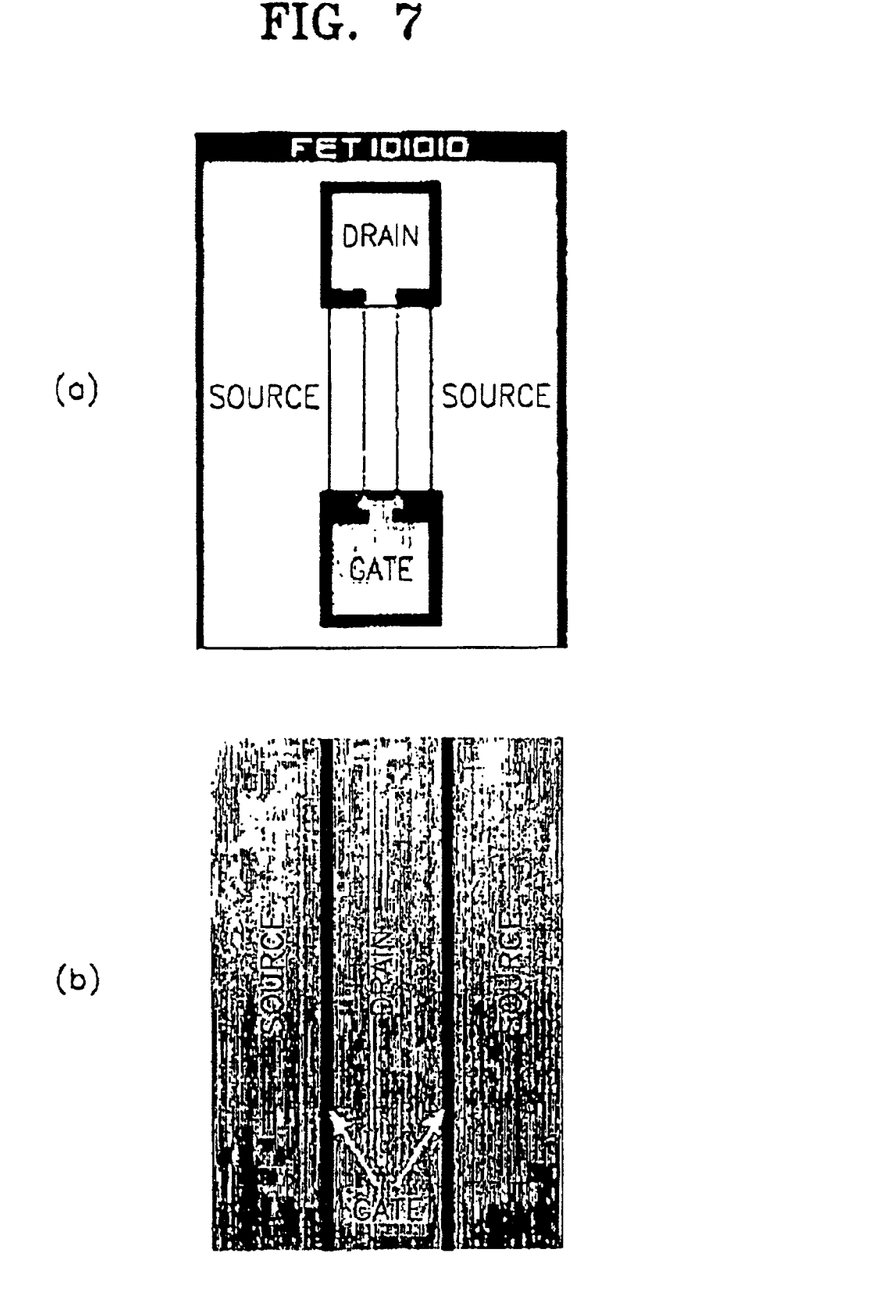
FIG. 7 includes diagrams illustrating the planar state of a HFET device manufactured according to a preferred embodiment of the present invention.

FIG. 7 includes diagrams illustrating the planar state of a HFET device manufactured according to Example 1 of the present invention. Referring to FIG. 7, if a source electrode and a drain electrode are formed after a gate electrode is formed, it is possible to form a finer and flatter gate electrode.

Figure 8:
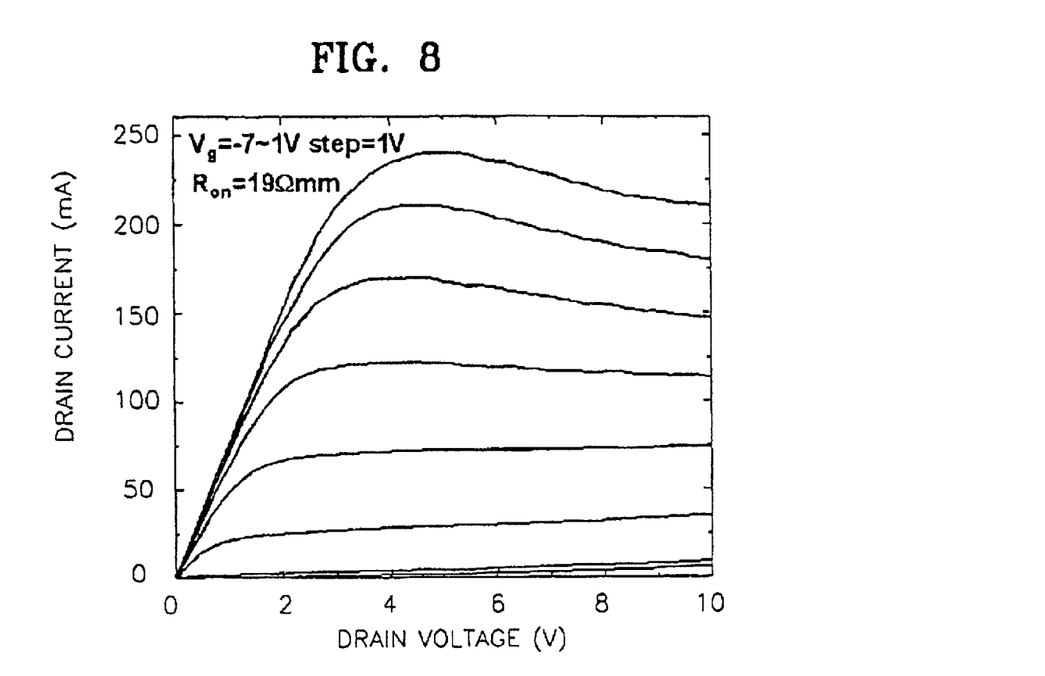
FIG. 8 is a graph showing the variation of drain current in accordance with the variation of drain voltage in a HFET device manufactured according to Example 1 of the present invention.

FIG. 8 is a graph showing the variation of drain current in accordance with the variation of drain voltage in a HFET device manufactured according to the first embodiment of the present invention. Referring to FIG. 8, pinch off voltage, which can completely close a channel, is about −7 V, and knee voltage, which represents the amplification efficiency of a device, is about 4.3 V.

Figure 9:
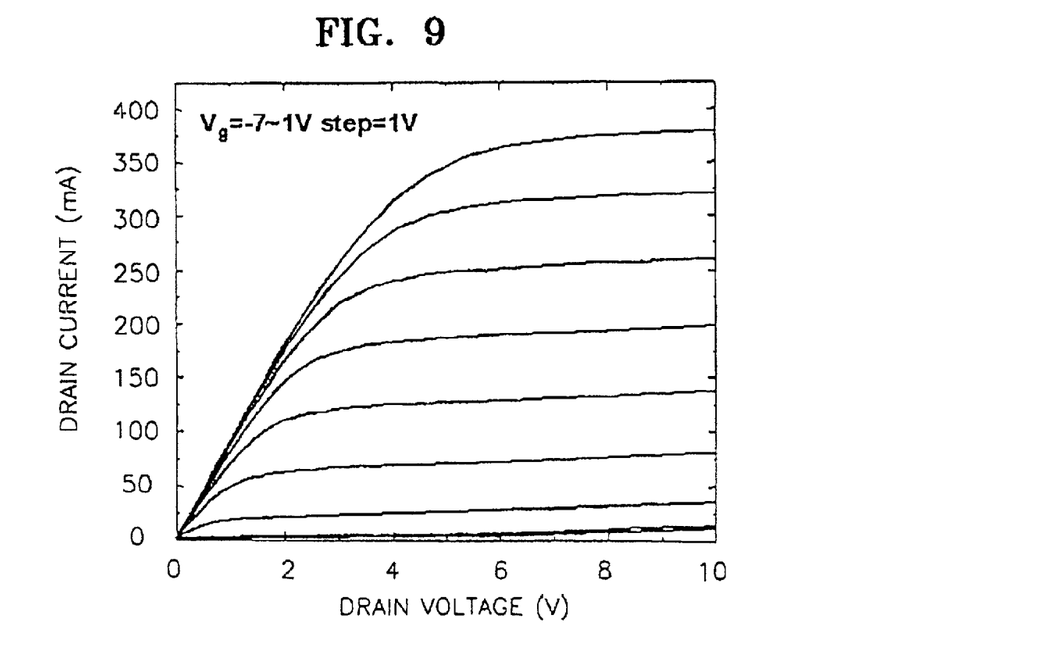
FIG. 9 is a graph showing the variation of drain current in accordance with the variation of drain pulse voltage in a HFET device manufactured according to Example 1 of the present invention.

FIG. 9 is a graph showing the variation of drain current in accordance with the variation of drain pulse voltage in a HFET device manufactured according to Example 1 of the present invention. The results shown in FIG. 9 were obtained by a measuring method using pulse voltage, which is capable of preventing the performance of a device from deteriorating due to heat generated therein when the magnitude of voltage applied to a gate electrode increases. Referring to FIG. 9, pinch off voltage is about −7 V, the maximum source-drain saturation current is about 735 mA/mm, and knee voltage is about 4.2 V.

Figure 10:
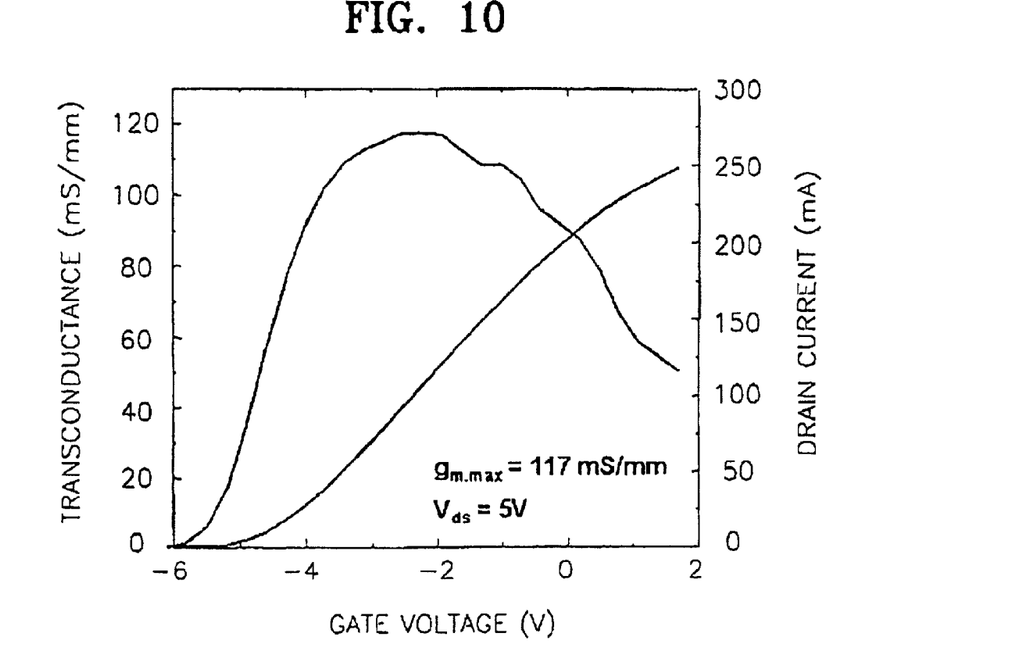
FIG. 10 is a graph showing the variation of drain current and transconductance in accordance with the variation of gate direct current voltage in a HFET device manufactured according to Example 1 of the present invention.

FIG. 10 is a graph showing the variation of drain current and transconductance in accordance with the variation of gate direct current voltage in a HFET device manufactured according to Example 1 of the present invention. Referring to FIG. 10, the maximum transconductance is about 117 mS/mm and the maximum drain current is about 250 mA.

Figure 11:
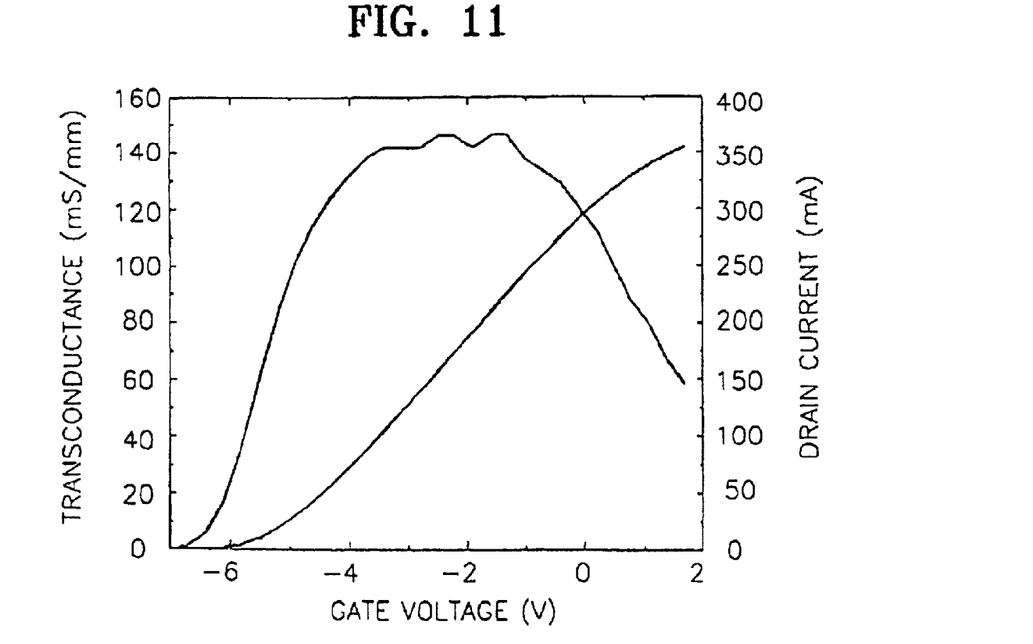
FIG. 11 is a graph showing the variation of drain current and transconductance in accordance with the variation of gate pulse voltage in a HFET device manufactured according to the Example 1 of the present invention.

FIG. 11 is a graph showing the variation of drain current and transconductance in accordance with the variation of gate pulse voltage in a HFET device manufactured according to the first embodiment of the present invention. Referring to FIG. 11, the maximum transconductance is about 145.8 ms/mm, and the maximum drain current is about 887.5 mA. Thus, the HFET device according to the present invention is considered to have superior amplification capability.

As described above, in the present invention, a gate electrode is formed before ohmic electrodes are formed. Thus, it is possible to overcome a difficulty in aligning the gate electrode with the ohmic electrodes and prevent a substrate from having a step difference introduced by the ohmic electrodes. Accordingly, it is possible to form a finer photoresist layer pattern used to form the gate electrode and improve the degree, to which the gate electrode is aligned with the ohmic electrodes. In addition, in the present invention, the surface of an AlGaN semiconductor layer is treated with ICP before the ohmic electrodes are formed. Thus, it is possible to obtain ohmic characteristics without heat-treating a metal deposited on the AlGaN semiconductor layer to form the ohmic electrodes. Since the maximum transconductance and maximum drain current characteristics of the AlGaN/GaN HFET device according to the present invention are good, the AlGaN/GaN HFET device can have improved amplification capability.

What is claimed is:

1. A method for manufacturing a hetero-junction field effect transistor (HFET) device, the method comprising:
   (a) sequentially forming a non-doped GaN semiconductor layer and an AlGaN semiconductor layer on a substrate;
   (b) separating devices from each other by etching the non-doped GaN and AlGaN semiconductor layers;
   (c) forming a photoresist layer pattern on the AlGaN semiconductor layer and forming gate electrodes by depositing a material on the substrate using the photoresist layer pattern;
   (d) treating the surface of the AlGaN semiconductor layer; and
   forming a photoresist layer pattern on the AlGan semiconductor layer and forming ohmic electrodes by depositing a metal on the AlGaN semiconductor layer using the photoresist layer pattern.

2. The method of claim 1, wherein the step (d) is performed using inductively coupled plasma (ICP).

3. The method of claim 2, wherein the step (d) is performed using ICP generated from at least one selected from the group consisting of $N_2$, Ar, $Cl_2$, $BCl_3$, $H_2$ and $O_2$.

4. The method of claim 2, wherein the step (d) is performed using ICP in a chamber having a pressure of 5–10 mTorr with a gas flow rate of 10–30 sccm, a source power of 200–800 W, and a chuck power of 50–100 W for 1–3 minutes.

5. The method of claim 1, wherein the line width of the gate electrode in the step (c) is 0.5–1 μm.

6. The method of claim 1, wherein the material used to form the gate electrodes in the step (c) and the material used to form the ohmic electrodes in the step (e) are deposited on the substrate by electron beam deposition or thermal deposition.

7. The method of claim 1, wherein the gate electrodes are formed of at least one selected from the group consisting of Pt, Pd, Ni, and Au.

8. The method of claim 1, wherein the ohmic electrodes are formed of a Ti/Al layer or a Ti/Al/Ni/Au layer.

9. The method of claim 1, wherein the substrate is a sapphire substrate or a silicon carbide substrate.

* * * * *